United States Patent [19]

Samoto

[11] Patent Number: 5,750,209
[45] Date of Patent: May 12, 1998

[54] METHOD FOR PRODUCING MAGNETIC RECORDING MEDIUM AND APPARATUS THEREFOR

[75] Inventor: Tetsuo Samoto, Miyagi, Japan

[73] Assignee: Sony Corporation, Tokyo, Japan

[21] Appl. No.: 718,231

[22] Filed: Sep. 20, 1996

[30] Foreign Application Priority Data

Sep. 26, 1995 [JP] Japan .................. 7-248061

[51] Int. Cl.⁶ .................................. H05H 1/24
[52] U.S. Cl. ............... 427/569; 118/50.1; 118/718; 118/723 R; 118/723 VE; 427/131; 427/249; 427/255.2; 427/398.2; 427/490; 427/577; 427/585
[58] Field of Search .................. 427/490, 577, 427/585, 249, 255.2, 131; 118/718, 723 VE, 723 R, 50.1

[56] References Cited

U.S. PATENT DOCUMENTS

4,135,031   1/1979   Akashi et al. .................. 427/130 X
5,104,756   4/1992   Fukuda et al. .................. 430/58
5,322,716   6/1994   Takahashi et al. .................. 427/132 X
5,488,528   1/1996   Chen et al. .................. 360/126

*Primary Examiner*—Bernard Pianalto
*Attorney, Agent, or Firm*—Hill & Simpson

[57] ABSTRACT

There are disclosed method and apparatus for producing a magnetic recording medium including a non-magnetic substrate, a magnetic layer formed on one surface of said non-magnetic substrate and a back coat layer formed on an opposite surface of said non-magnetic substrate. By using the method and the apparatus, the magnetic recording medium having the back coat layer, which exhibits a high lubricating property and a low dynamic friction coefficient, can be produced with a high operating efficiency. The method includes the steps of forming the back coat layer by a plasma chemical vapor deposition and supplying a lubricant, substantially at the time when the back coat layer is formed by the plasma chemical vapor deposition, such that the lubricant is introduced into the back coat layer.

9 Claims, 5 Drawing Sheets

METHOD FOR PRODUCING MAGNETIC RECORDING MEDIUM AND APPARATUS THEREFOR

BACKGROUND OF THE INVENTION

1. Field of the Invention

The present invention relates to a method for producing a magnetic recording medium and an apparatus used therefor, and more particularly to an improved method for forming a back coat layer on the magnetic recording medium.

2. Prior Art

Hitherto, the coating-type magnetic recording media have been extensively utilized. The conventional coating-type magnetic recording media have been produced in such a manner that a magnetic coating material, which is prepared by dispersing a magnetic powder such as magnetic oxide powder and magnetic alloy powder in an organic solvent composed of a vinyl chloride/vinyl acetate copolymer, a polyester resin, an urethane resin or a polyurethane resin, is coated on a non-magnetic substrate, and then dried to form a magnetic layer thereon.

In the field of video tape recorders (VTR), there is an increasing demand for highly-densified recording in order to form images with a high quality. Under these circumstances, intense attention has been paid to a so-called ferromagnetic metal thin film-coating type magnetic recording media and many proposals for the production thereof have been made. The conventional ferromagnetic metal thin film-type magnetic recording media have been produced by directly depositing a magnetic metal material such as cobalt-nickel-based alloy, cobalt-chromium-based alloy or cobalt-oxygen-based alloy onto a non-magnetic substrate such as a polyester film, a polyamide film or a polyimide film by using a plating method or a vacuum thin film-formation technique such as a vacuum deposition method, a sputtering method, an ion-plating method, or the like to form a magnetic layer on the non-magnetic substrate.

The ferromagnetic metal thin film-type magnetic recording media have various advantages. For example, the magnetic recording media exhibit not only excellent coercive force, remanence ratio and electromagnetic conversion property in a short-wavelength region, but also considerably reduced recording-demagnetization and low thickness loss upon reproduction because of its thinned magnetic layer. In addition, in the magnetic recording media of this type, a high packing density of a magnetic material is realized because it is unnecessary to use a non-magnetic binder or the like in the magnetic layer.

In the meantime, in the field of magnetic recording media, in order to positively control characteristics of its back surface opposite to a surface where the magnetic layer is formed, a back coat layer is formed thereon. The back coat layer is useful for (1) reducing an electrical surface resistance of the magnetic recording medium to thereby prevent the magnetic recording medium from being undesirably charged, (2) preventing the magnetic recording medium from being loosely or unevenly wound into a roll at a so-called fast-forward or rewind operation mode and thereby prohibiting failure in wound shape or wound state of the magnetic recording medium upon long--term storage and transportation, (3) enhancing a durability of the surface of a base film as the non-magnetic substrate whereby a surface of the magnetic recording medium is effectively prevented from undergoing scores during use, resulting in suppressing occurrence of drop-out, and (4) reducing the friction between adjacent portions of the magnetic recording medium, or the like.

In both of the coating-type magnetic recording medium and the ferromagnetic metal thin film-type magnetic recording medium, the conventional back coat layer has been prepared from a back coating material composed of a non-magnetic pigment, a binder, etc. .

Typical one of the non-magnetic pigments used for the preparation of the conventional back coat layer is carbon. The non-magnetic pigment can be used in combination with hematite, mica, silica gel, calcium carbonate, or the like, if desired. Examples of the binder used for the preparation of the conventional back coat layer include a vinyl chloride-vinyl acetate copolymer, a vinyl chloride-vinyl acetate-vinyl alcohol copolymer, a vinyl chloride-vinyl acetate-maleic acid copolymer, a vinyl chloride-vinylidene chloride copolymer, a vinyl chloride-acrylonitrile copolymer, an acrylate-acrylonitrile copolymer, an acrylate-vinylidene chloride copolymer, a methacrylate-styrene copolymer, or a mixture of any two or more thereof.

However, in these wet-type processes in which a magnetic layer is produced by coating method, since it is necessary to use a large amount of an organic solvent, there arises a problem such as environmental pollution.

In addition, especially in the production of the ferromagnetic metal thin film type magnetic recording medium, the magnetic layer (ferromagnetic metal thin film) is formed by using a vacuum thin film formation technique such as vacuum deposition. Nevertheless, it is required that the back coat layer is prepared according to the wet-type production process which is often called "wet process." In consequence, the production of the ferromagnetic thin film type magnetic recording medium with the back coat layer requires both of the wet-type production step and the production step using a vacuum thin film formation technique, resulting in increase in number of apparatuses required and therefore enhancement in production cost.

Whereas, there is a recent tendency that a tape cassette is miniaturized and a thickness of a magnetic tape accommodated within the limited space of the tape cassette is reduced to achieve a long-time recording and reproduction. In such a magnetic tape, it is required to reduce deterioration in mechanical strength thereof.

However, in the case of the conventional coating-type magnetic recording medium, the thickness of the back coat layer cannot be reduced to a sufficient extent. As a result, a ratio of the thickness of the back coat layer to that of the entire magnetic tape is raised so that the mechanical strength of the magnetic tape is deteriorated.

Further, the conventional back coat layer cannot necessarily show a sufficient lubricating properties.

SUMMARY OF THE INVENTION

It is therefore an object of the present invention to provide method and apparatus for producing a magnetic recording medium, by which a back coat layer having a small thickness can be easily formed on a non-magnetic substrate without deterioration in mechanical strength of an entire portion of the magnetic recording medium, so that the magnetic recording medium having a sufficient lubricating properties can be produced with a high operating efficiency.

It is another object of the present invention to provide method and apparatus for producing a magnetic recording medium, by which, in the case where a magnetic layer is formed by using a vacuum thin film-formation technique such as vapor deposition, both the magnetic layer and the back coat layer can be prepared by a common single apparatus, resulting in reduction in number of apparatuses required and effective utilization thereof.

As a result of intense studies made by the present inventors in order to achieve the afore-mentioned objects, it has been found that, in the method in which a magnetic layer and a back coat layer are formed on opposite surfaces of a non-magnetic substrate, the back coat layer is preferably produced by the vacuum thin film formation technique and further the magnetic recording medium satisfying the afore-mentioned requirements (1) to (4) and showing high lubricating properties can be obtained by supplying a lubricant substantially at the time when the back coat layer is formed.

In an aspect of the present invention, there is provided a method for producing a magnetic recording medium composed of a non-magnetic substrate, a magnetic layer formed on one surface of the non-magnetic substrate and a back coat layer formed on an opposite surface of the non-magnetic substrate, which method includes the steps of forming the back coat layer by a plasma chemical vapor deposition, and supplying a lubricant substantially at the time when the back coat layer is formed by the plasma chemical vapor deposition, such that a sufficient amount of the lubricant is introduced into the back coat layer.

In a second aspect of the present invention, there is provided an apparatus for producing a magnetic recording medium composed of a non-magnetic substrate, a magnetic layer formed on one surface of the non-magnetic substrate and a back coat layer formed on an opposite surface of the non-magnetic substrate, which apparatus includes a film-forming means for forming the back coat layer by a plasma chemical vapor deposition, and a lubricant-feeding means for supplying a lubricant substantially at the time when the back coat layer is formed by the plasma chemical vapor deposition, such that a sufficient amount of the lubricant is introduced into the back coat layer.

In a third aspect of the present invention, there is provided the apparatus defined in above second aspect, in which a plurality of film forming means and a plurality of lubricant-feeding means are arranged alternately.

In the meantime, the expression "substantially at the time" used throughout the specification and claims of this application means that the supply of the lubricant can be carried out immediately before, during or immediately after the formation of the back coat layer by the plasma chemical vapor deposition.

These and other objects, features, advantages of the present invention will become more apparently from the following detailed description when read in conjunction with the accompanying drawings and appended claims.

DETAILED DESCRIPTION OF PREFERRED EMBODIMENT

Magnetic recording media to which the method and the apparatus according to the present invention are applied, may be of a coating-type in which a magnetic coating material prepared by dispersing a magnetic powder in a binder is coated on a non-magnetic substrate, or a ferromagnetic thin film type in which a ferromagnetic metal material is directly deposited on the non-magnetic substrate by a vapor deposition method or the like.

In the case of the coating type magnetic recording medium, any known magnetic powder and binder can be used.

Further, in the case of the ferromagnetic metal thin film type magnetic recording medium whose magnetic layer is prepared by directly depositing the ferromagnetic metal material on the non-magnetic substrate, any ferromagnetic metal material conventionally known for the production of deposited metal film or tape can be used. Examples of the ferromagnetic metal materials include ferromagnetic metals such as Fe, Co or Ni, or ferromagnetic alloys such as Fe-Co, Co-Ni, Fe-Co-Ni, Fe-Cu, Co-Cu, Co-Au, Co-Pt, Mn-Bi, Mn-Al, Fe-Cr, Co-Cr, Ni-Cr, Fe-Co-Cr, Co-Ni-Cr or Fe-Co-Ni-Cr. The magnetic layer in the form of a ferromagnetic metal thin film may be composed of a single layer or multiple layers. In the case where the magnetic layer is composed of multiple layers, intermediate layers may be interposed between the multiple layers in order to enhance an adhering force between the respective layers and control a coercive force thereof. Further, an oxide layer can be provided near a surface of the magnetic layer to impart an anti-corrosion property thereto.

As a method for forming the ferromagnetic metal thin film, there can be used so-called PVD methods such as a vacuum deposition method in which the ferromagnetic metal material is heated and vaporized in vacuo and deposited on a non-magnetic substrate, an ion-plating method in which the ferromagnetic metal material is vaporized under discharging condition or a sputtering method in which glow discharge is caused in an atmosphere composed primarily of argon and a surface of target is bombarded with the resultant argon ion to strike out target atoms therefrom, or chemical vapor deposition (CVD) methods such as a high-frequency plasma CVD method, a can-opposed plasma CVD method, a plasma irradiation CVD method, an ECR plasma CVD method, a torch type plasma CVD method or an arc-jet CVD method.

Further, any non-magnetic substrate used for conventional magnetic recording media of this type can be used in the present invention. Examples of the non-magnetic substrates may include those composed of polyesters, polyamides, polyolefins, vinyl-based resins, polyimides, polycarbonates, or the like.

In accordance with the present invention, the back coat layer is provided on the back surface of the non-magnetic substrate, opposite to the surface where the magnetic layer is formed. Examples of the materials for the back coat layer may include carbon such as so-called diamond carbon or diamond-like carbon, $SiO_2$, $Al_2O_3$, or the like.

The back coat layer is preferably produced by a high-frequency plasma CVD method. However, other methods such as a can-opposed plasma CVD method, a plasma irradiation CVD method, an ECR plasma CVD method, a torch-type plasma CVD method, or the like are also applicable.

The lubricants introduced or impregnated upon the formation of the back coat layer may be, for example, perfluoroether, triethyl thiophosphite, or the like. However, the lubricant introduced is not restricted to particular ones but any normally used lubricants are applicable.

In accordance with the present invention, in the magnetic recording medium of the type in which a ferromagnetic metal thin film is formed on the non-magnetic substrate using vacuum thin film formation techniques, the back coat layer is formed by the plasma CVD method, so that a fraction defective thereof can be suppressed to a considerably low level as compared to the conventional coating-type magnetic recording media. This also makes it possible to produce the back coat layer having a small thickness with a high operating efficiency.

Specifically, in accordance with the present invention, the lubricant is gasified and then introduced or impregnated in the back coat layer while being maintained in a gaseous state substantially at the time when the back coat layer is formed by the plasma chemical vapor deposition. As a result, the lubricant can be present within the back coat layer in an amount sufficient to ooze to the surface thereof. The lubricant can be successively supplied over the surface of the back coat layer before the lubricating properties on the surface of the back coat layer are deteriorated, so that adjacent portions of the magnetic recording medium can be in close contact with each other.

The preferred embodiments of the present invention are described below but it is to be understood that these embodiments is only illustrative and therefore the present invention is not limited thereto.

First Preferred Embodiment of Apparatus for the Production of Magnetic Recording Medium:

The apparatus described in this embodiment serves for producing both the magnetic layer (ferromagnetic metal thin film) and the back coat layer, and includes a vacuum container, a cooling can, a traveling mechanism or the like, which are commonly usable for the production of both the layers, whereby an effective utilization of the apparatus can be accomplished.

Figure 1:
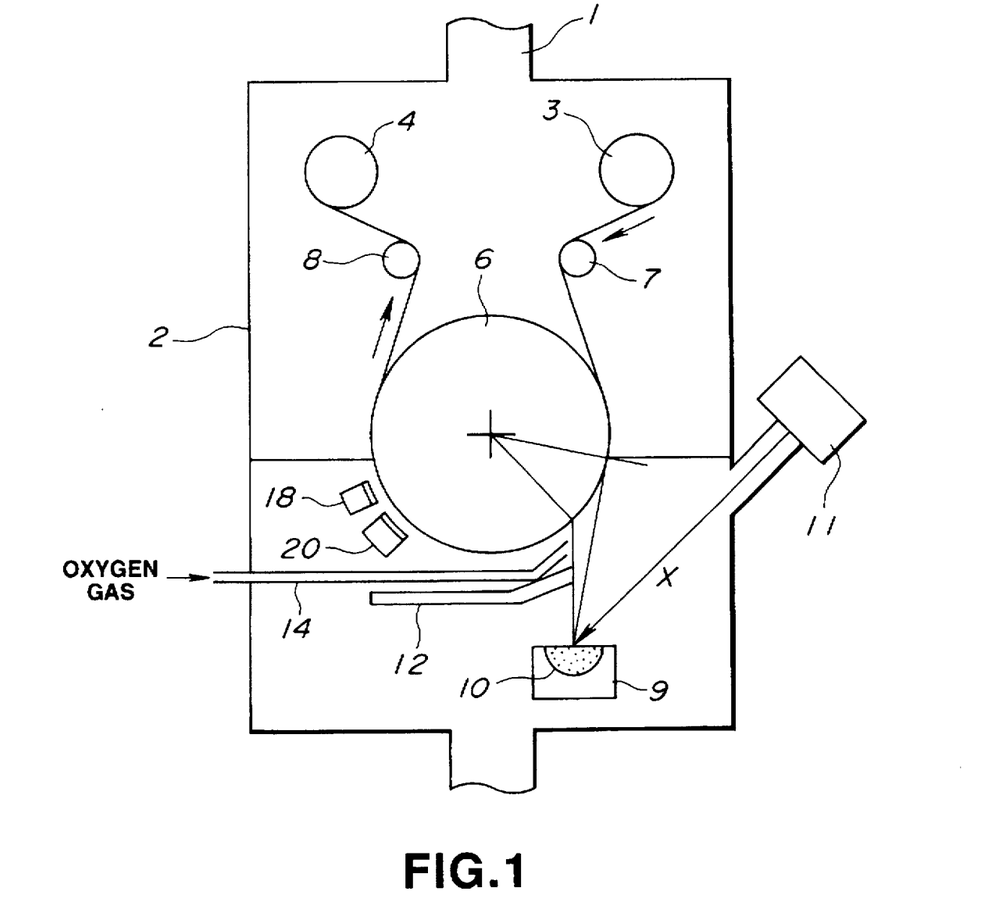
FIG. 1 is an elevation view schematically showing one preferred embodiment of an apparatus for the production of a magnetic recording medium according to the present invention.

Referring now to FIG. 1, there is shown an apparatus having a vacuum chamber 2 therein. Discharge ports 1 are provided at top and bottom portions of the vacuum chamber 2. An interior of the vacuum chamber 2 is evacuated through the discharge ports 1 and maintained in vacuum condition. Accommodated within the vacuum chamber 2 are a feed roll 3 adapted to rotate at a constant velocity in the clockwise direction and a take-up roll 4 also adapted to rotate at a constant velocity in the clockwise direction. A tape-like non-magnetic substrate 5 is traveled from the feed roll 3 to the take-up roll 4 through a cooling can 6.

The cooling can 6 having a larger diameter than those of the feed and take-up rolls 3 and 4 is disposed between and downwardly apart from the feed and take-up rolls 3 and 4. The tape-like non-magnetic substrate 5 is drawn downwardly from the feed roll and looped or wrapped around an outer periphery of the cooling can 6 which is also adapted to rotate at a constant velocity in the clockwise direction. The feed roll 3, the take-up roll 4 and the cooling can 6 all are of a cylindrical shape and each have approximately the same length as a width of the non-magnetic substrate 5. The cooling can 6 accommodates a cooling device (not shown) therein. The cooling device is adapted to cool the non-magnetic substrate being traveled therealong, thereby preventing deformation of the non-magnetic substrate 5 due to temperature rise or the like deficiencies.

Thus, the tape-like non-magnetic substrate is successively fed from the feed roll 3, passed along the peripheral surface of the cooling can 6 and finally wound on the take-up roll 4. A pair of guide rolls 7 and 8 are provided between the cooling can 6 and the feed roll 3 and between the cooling can 6 and the take-up roll 4, respectively, to apply an appropriate tension force to the non-magnetic substrate 5, such that the non-magnetic substrate 5 can be smoothly traveled from the feed roll 3 to the take-up roll 4 through the cooling can 6.

Within the vacuum chamber 2, a crucible 9 is disposed beneath the cooling can 6 and filled with a magnetic metal material 10. The crucible 9 has a width approximately similar to a length of the cooling can 6 along a center axis thereof.

An electron beam (EB) gun 11 is mounted on a side wall of the vacuum chamber 2 to heat and evaporate the magnetic metal material 10 filled in the crucible 9. The electron beam gun 11 is arranged at such a position that an electron beam X emitted therefrom is directed to and irradiated on the magnetic metal material 10 within the crucible 9. Thus, the magnetic metal material 10 is melted and evaporated by the irradiation of the electron beam X emitted from the EB gun and then deposited on a surface of the non-magnetic substrate 5 which is now transported at a constant velocity along the peripheral surface of the cooling can 6, to form a magnetic layer thereon.

A shutter 12 is positioned between the cooling can 6 and the crucible 9 in proximity to the cooling can 6. The shutter 12 is so arranged as to cover a certain region of the non-magnetic substrate transported along the peripheral surface of the cooling can 6 at a constant velocity, whereby the magnetic metal material 10 evaporated is directed towards the non-magnetic substrate at a given inclined angle relative thereto and deposited on the surface of the non-magnetic substrate 5. When the magnetic metal material 10 is deposited on the surface of the non-magnetic substrate 5, an oxygen gas is supplied to the surface of the non-magnetic substrate 5 through an oxygen gas-feeding pipe 14 which penetrates a side wall of the vacuum chamber 2 and extends up to a position near the peripheral surface of the cooling can 6. The presence of the oxygen gas upon the deposition of the magnetic metal material 10 permits the resultant magnetic thin film on the non-magnetic substrate to have improved magnetic properties, durability and weather resistance.

Figure 2:
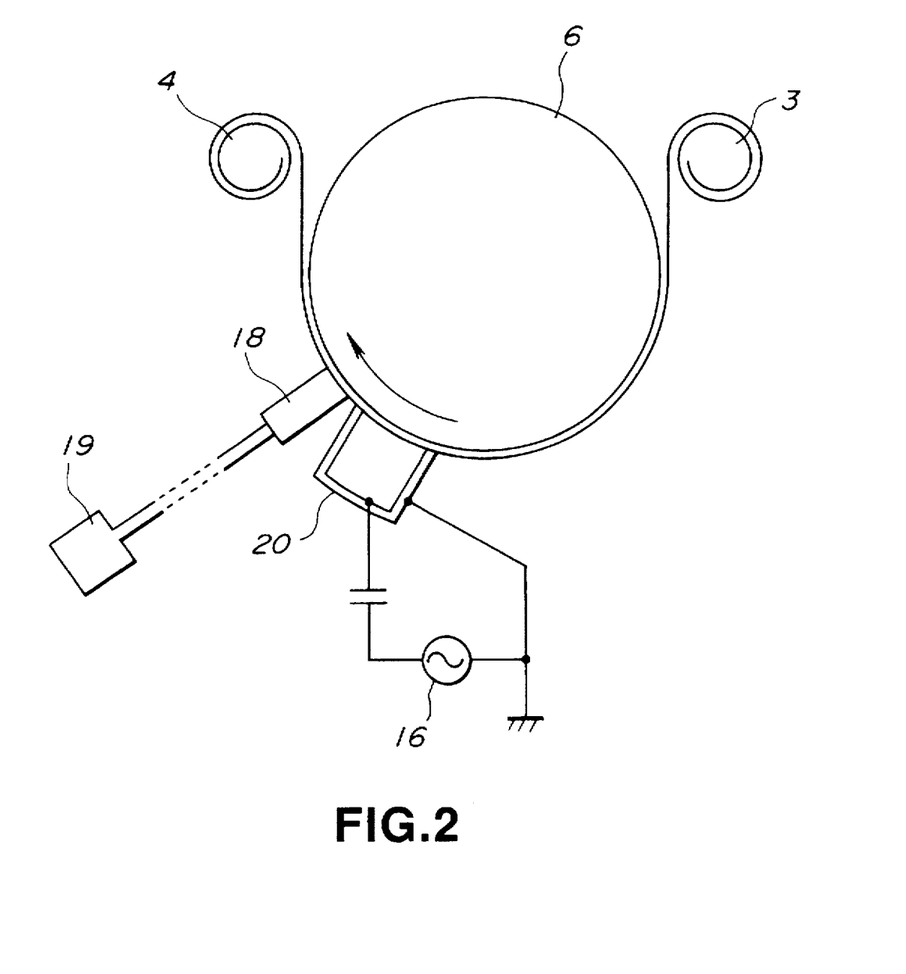
FIG. 2 is an enlarged view schematically showing a portion of the apparatus shown in FIG. 1.

As shown in FIG. 2, within the vacuum chamber 2, a can-opposed RF (high-frequency) plasma CVD unit 20 is disposed beneath and in close proximity to the cooling can 6 at a position slightly offset from a vertical center line thereof such that an operating surface of the CVD unit 20 faces the peripheral surface of the cooling can 6 in approximately parallel relation. The can-opposed RF (high-frequency) plasma CVD unit 20 serves as a means for forming a back coat layer on a back surface of the non-magnetic substrate. The can-opposed RF (high-frequency) plasma CVD unit 20 includes opposed electrodes to which a bias voltage is applied from an RF power source 16.

Specifically, in this embodiment, the can-opposed RF (high-frequency) plasma CVD unit 20 is of a so-called hollow-anode type which includes a box-shaped (hollow) electrodes 20a and 20b of which the electrode 20a is disposed inside in opposed relation to the peripheral surface of the cooling can 6 and serves as an anode electrode while the electrode 20b is disposed outside so as to surround the anode electrode 20a via a layer composed of an insulating material and serves as a cathode electrode.

Thus, since the can-opposed RF (high-frequency) plasma CVD unit 20 of such a hollow-anode type has a concaved (hollow) anode electrode and an alternating current is supplied to the concaved anode electrode through a capacitor, a large bias voltage can be produced on the anode electrode 20a, whereby a film formation rate can be improved and therefore a hard film composed of the magnetic metal material 10 can be formed.

Accordingly, by modifying an apparatus normally used for forming a magnetic layer composed a ferromagnetic metal thin film on the non-magnetic substrate 5 by a vacuum thin film formation technique, it also becomes possible to form both the magnetic layer and the back coat layer using a common single apparatus.

Disposed adjacent to the can-opposed RF (high-frequency) plasma CVD unit 20 is a feed container 18 serving as a means for supplying a lubricant. The lubricant is supplied from the feed container 18 to the back surface of the base film as the non-magnetic substrate 5 before the lubricating properties on the back surface is deteriorated, so that adjacent portions of the non-magnetic substrate 5 can maintain a close contact with each other.

As shown in FIG. 2, a fluid supply device 19 is provided behind the feed container 18 which is in fluid communication with the feed container 18 via appropriate feed passage. The fluid supply device 19 evaporates the lubricant stored therein which is then fed in a predetermined amount each feeding operation into the vacuum chamber 2.

Figure 3:
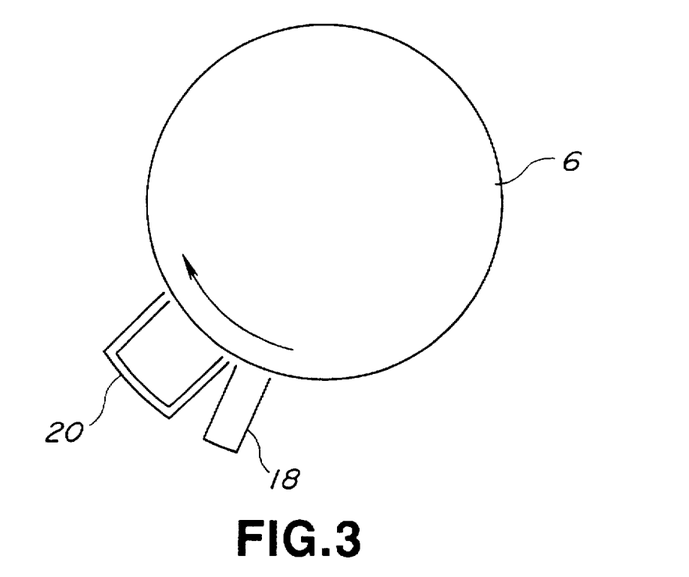
FIG. 3 is an elevation view schematically showing an example of arrangement of a plasma chemical vapor deposition unit and a lubricant-supplying means applied to the apparatus of FIG. 1.
Figure 4:
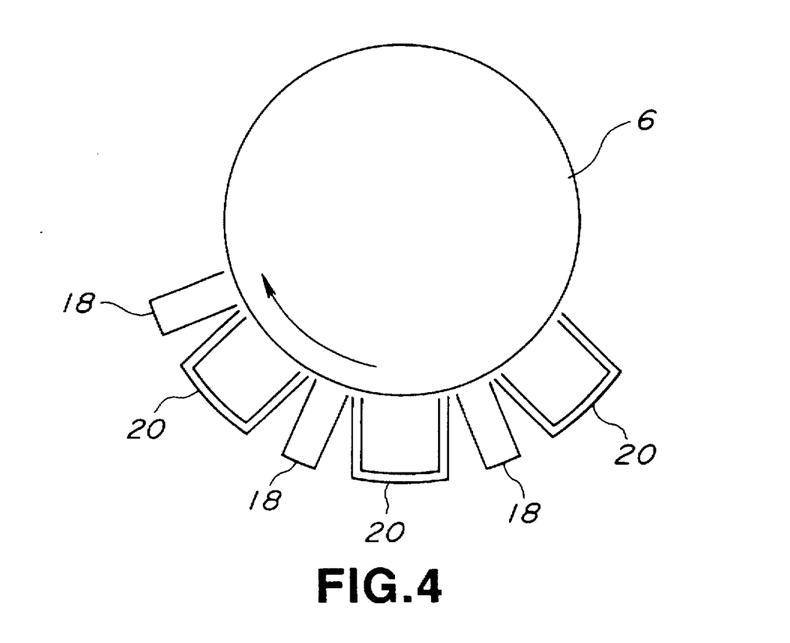
FIG. 4 is an elevation view schematically showing an example of alternate arrangement of a plurality of plasma chemical vapor deposition units and a plurality of lubricant-supplying means applied to the apparatus of FIG. 1.

In addition to the afore-mentioned arrangement in which the feed container 18 for supplying the lubricant is disposed immediately after the plasma CVD unit 20 for forming the back coat layer, the feed container 18 may be disposed immediately before the plasma CVD unit 20 as shown in FIG. 3 to achieve a high lubricating effect due to oozing-out of the lubricant to the surface of the back coat layer. Alternatively, as shown in FIG. 4, a plurality of the can-opposed RF (high-frequency) plasma CVD units 20 and a plurality of the feed containers 18 may be alternately arranged along the peripheral surface of the cooling can 6 so that the lubricant can be supplied during the formation of the back coat layer.

In operation of the apparatus according to the first preferred embodiment of the present invention, the magnetic metal material 10 is evaporated and deposited on one surface of the tape-like non-magnetic substrate 5 to form a ferromagnetic metal thin film as the magnetic layer thereon. Thereafter, the tape-like non-magnetic substrate is reversed such that a back surface of the non-magnetic substrate, opposite to the surface where the ferromagnetic metal thin film is formed, faces outward when looped or wrapped around the cooling can 6. As the tape-like non-magnetic substrate 5 is traveled along the peripheral surface of the cooling can 6, the can-opposed RF (high-frequency) plasma CVD unit 20 is operated while supplying the gaseous lubricant from the fluid supply device 19 via the feed container 18 to thereby form the back coat layer on the back surface of the non-magnetic substrate 5. As will be apparently appreciated, a sequential order of steps for forming the magnetic layer and the back coat layer is not limited to the afore-mentioned one. For example, the back coat layer may be first formed on one surface of the non-magnetic substrate and thereafter the magnetic layer may be formed on an opposite surface of the non-magnetic substrate 5.

Second Preferred Embodiment of Apparatus for the Production of Magnetic Recording Medium:

In this embodiment, there is illustrated an apparatus which is capable of successively or continuously producing a magnetic layer, a protective layer and a back coat layer.

Figure 5:
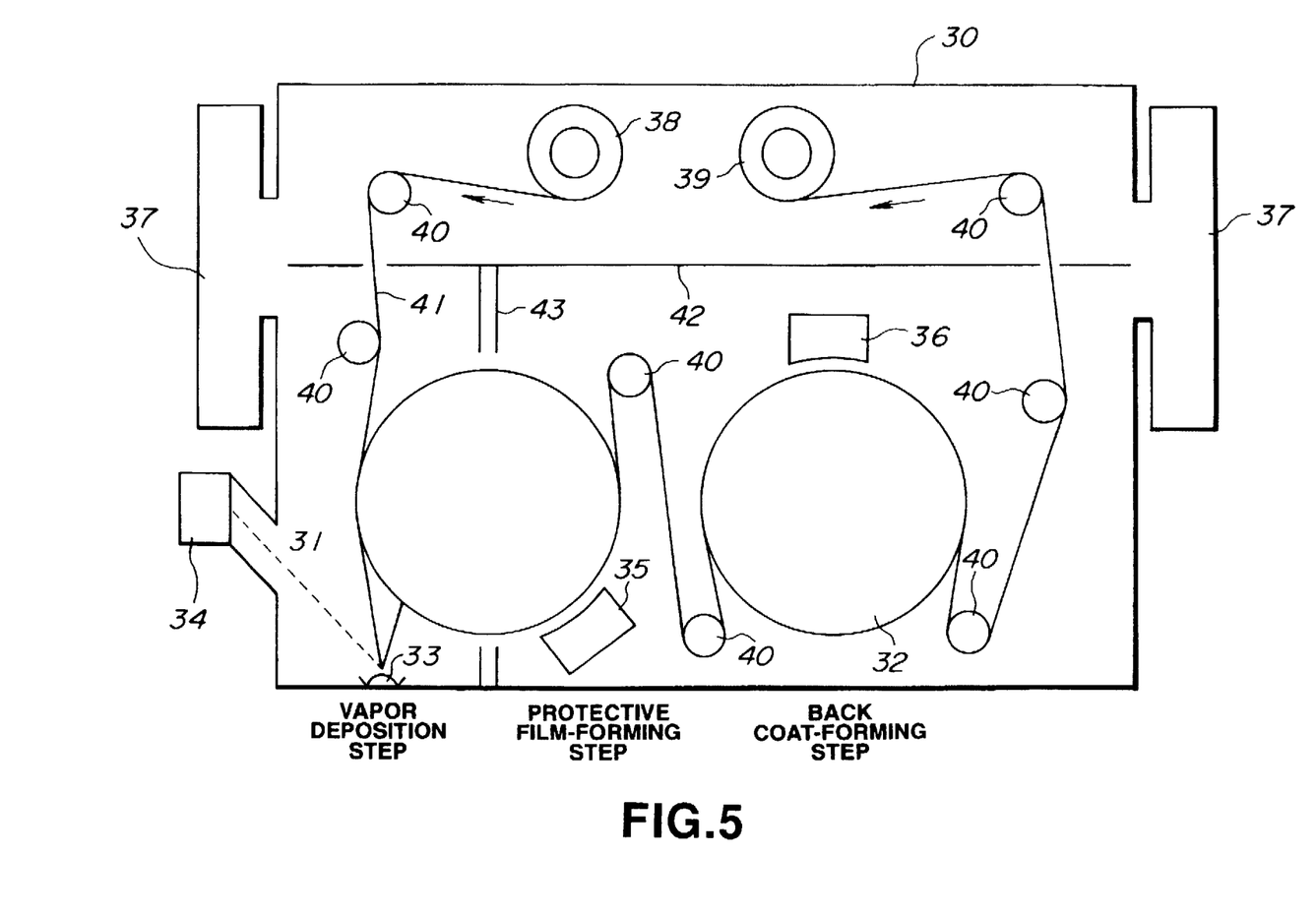
FIG. 5 is an elevation view schematically showing another preferred embodiment of an apparatus for the production of a magnetic recording medium according to the present invention.

Referring to FIG. 5, the apparatus according to the second embodiment of the present invention includes a vacuum container 30 in which two cooling cans 31 and 32 are accommodated. Opposed to one cooling can 31 are a crucible 33 in which a ferromagnetic metal material to be deposited is received, an electron beam (EB) gun 34 and a CVD reaction tube 35 for forming a protective film. On the other hand, opposed to the other cooling can 32 is a CVD reaction tube 36 for forming a back coat layer. The CVD reaction tube 36 is provided therein with a lubricant-feeding means similar to that mentioned in the preceding embodiment.

The vacuum container 30 has discharge mechanisms 37 such as a vacuum pump and further is provided therein with a feed roll 38, a take-up roll 39 and guide rolls 40. These rolls 38, 39 and 40 constitute a tape traveling system for a non-magnetic substrate 41. Furthermore, various partition plates may be provided within the vacuum container 30, and includes, for example, a partition 42 for separating and shielding the feed roll 38 and the take-up roll 39 from a film-forming zone or a partition 43 disposed in close proximity to the cooling can 31 for separating and shielding a deposition system such as the crucible 33 from a CVD system such as the CVD reaction tube 35.

In the apparatus with the afore-mentioned arrangement, the tape-like non-magnetic substrate is fed from the feed roll 38 and then looped around the cooling can 31 such that one surface thereof faces outward.

While being traveled along a peripheral surface of the cooling can 31, the non-magnetic substrate 41 is first exposed to evaporated ferromagnetic metal material which is generated from the crucible 33 upon irradiation of electron beam by an electron beam (EB) gun 34, whereby a magnetic layer composed of the ferromagnetic metal material is formed on the one surface of the non-magnetic substrate. Successively, a protective film composed of, for example, carbon, is formed on the magnetic layer when the non-magnetic substrate 41 is passed over the CVD reaction tube 35.

Next, the non-magnetic substrate 41 is looped or wrapped around a peripheral surface of the cooling can 32 such that a back surface of the non-magnetic substrate 41, opposite to the surface where the magnetic layer and the protective film are formed, faces outward.

While being traveled along the cooling can 32, the non-magnetic substrate 41 is passed over a region opposed to the CVD reaction tube 36, upon which a back coat layer is formed on the back surface of the non-magnetic substrate 41. The non-magnetic substrate 41 thus traveled is finally wound on the take-up roll 39.

Thus, by using the afore-mentioned apparatus, the steps from formation of the magnetic layer to formation of the back coat layer can be continuously carried out in-line mode of operation. However, in this case, since the deposition system and the CVD system are operated at different film-forming rates, it is difficult to effectively control a traveling speed of the non-magnetic substrate 41. Accordingly, it is preferred that the alternate arrangement of a plurality of CVD units and a plurality of lubricant-feeding means as shown in FIG. 4 is applied to the continuously-operating apparatus of this embodiment to effectively control thicknesses of the respective layers.

EXAMPLE:

Production of Magnetic Recording Medium:

By using the afore-mentioned apparatuses, a magnetic recording medium having a back coat layer was prepared. Incidentally, a magnetic layer composed of a ferromagnetic metal thin film was formed on a non-magnetic substrate 5 by vacuum thin film formation techniques in the same manner as used conventionally.

Specifically, in the production of the magnetic recording medium, a Co-Ni alloy was used as a raw material for the ferromagnetic metal thin film. The ferromagnetic thin film as a magnetic layer was prepared by a vacuum thin film formation technique while supplying an oxygen gas.

After completing the formation of the ferromagnetic thin film, the back coat layer was formed on the back surface of the non-magnetic substrate opposite the surface where the ferromagnetic thin film was formed, while feeding a perfluoropolyether-based lubricant. Incidentally, in addition to the perfluoro-polyether-based lubricant, any lubricant optionally selected from triethyl thiophosphite and many other liquid lubricants, can be also used. The lubricant was vaporized and then adhered to the back coat layer in the same manner as described in the afore-mentioned preferred embodiments. More specifically, the lubricant was fed to the surface of the non-magnetic substrate before the lubricating properties thereof was deteriorated, whereby adjacent portions of the resultant magnetic recording medium could be in close contact with each other.

When the back coat layer was formed, the lubricant-feeding container 18 was so arranged that the supply of the lubricant was performed immediately before commencement of the formation of the back coat layer, as shown in FIG. 3. Alternatively, as shown in FIG. 4, the alternate arrangement of a plurality of the can-opposed RF (high-frequency) plasma CVD units 20 and a plurality of the lubricant-feeding containers 18 was adopted so as to achieve a high lubricating effect due to oozing-out of the lubricant to the surface of the back coat layer.

In this example, the tape-like non-magnetic substrate having an undercoat layer was treated in the apparatus as shown in FIGS. 1 to 4. Co-Ni alloy was evaporated and deposited onto the surface of the non-magnetic substrate from a direction inclined relative thereto in an oxygen atmosphere, so that the magnetic layer composed of ferromagnetic thin film was formed thereon. Thereafter, by using the apparatus as shown in FIG. 3, the back coat layer was formed on the back surface of the non-magnetic substrate opposite the surface where the magnetic layer was formed. The formation of the back coat layer was performed under the following conditions.

Raw gaseous material: toluene,
RF power: 1.0 kW,
Self-bias voltage: 200 V to 1,000 V,
Degree of vacuum: 8 Pa,
Substrate: polyethylene terephthalate (PET) film.

Simultaneously with the formation of the back coat layer, 1% solution of perfluoro-polyether-based lubricant in toluene was supplied from the fluid supply device 19 such that the back coat layer composed of carbon was exposed to the lubricant-containing solution immediately after completion of the formation of the back coat layer. At this time, the amount of the lubricant supplied was controlled such that a pressure within the fluid supply device 19 was approximately 10 Pa.

It was found that the back coat layer of the thus-prepared magnetic recording medium had a thickness of 15 nm and a dynamic friction coefficient of the magnetic recording medium was 0.22. Thus, it was confirmed that the magnetic recording medium prepared according to the present invention had a low dynamic friction coefficient.

Incidentally, the dynamic friction coefficient of the magnetic recording medium was measured by a dynamic friction coefficient measuring device (friction tester) under the following conditions.

Guide pin:
Contact angle: 90 wrap
Applied load: 10 gram-weight

Specifically, one type of magnetic recording medium on which the back coat layer was formed while supplying the lubricant and another type of magnetic recording medium on which the back coat layer was formed without supply of the lubricant were measured for change in their dynamic friction coefficients depending upon number of tape passes. The results are shown in FIG. 6.

Figure 6:
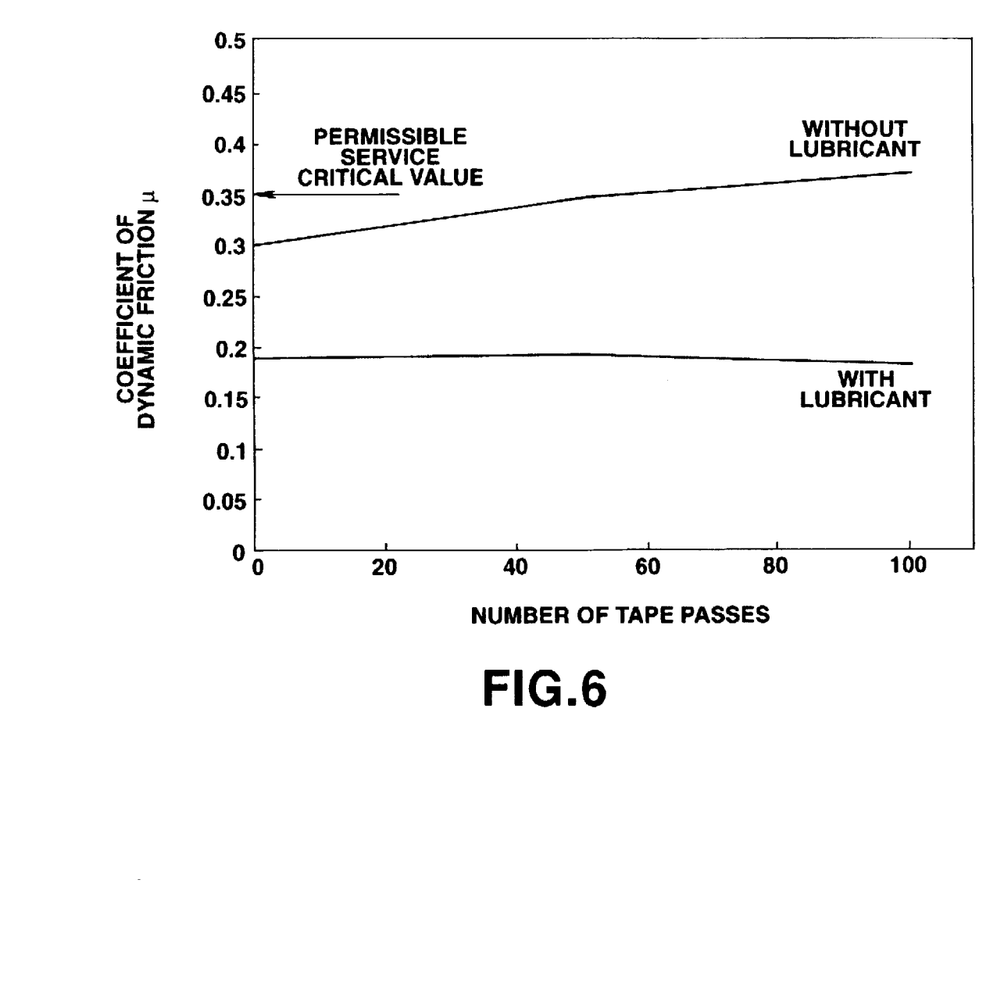
FIG. 6 is a characteristic curve showing change in dynamic friction coefficient of a magnetic recording medium depending upon presence or absence of lubricant in the back coat layer thereof.

As will be appreciated from FIG. 6, in the case where the back coat layer was formed while supplying the lubricant, almost no increase in the dynamic friction coefficient of the magnetic recording medium was observed even after subjected to repeated passes.

On the other hand, in the case where the back coat layer was formed without supply of the lubricant, the resultant magnetic recording medium exhibited a high initial dynamic friction coefficient. Further, increase in the dynamic friction coefficient thereof was observed when subjected to repeated passes, and the dynamic friction coefficient of the magnetic recording medium exceeded a permissible service critical value when subjected to more than 60 passes.

As described above, in the method for producing a magnetic recording medium according to the present invention, since a back coat layer is formed by a plasma chemical vapor deposition, a fraction defective thereof becomes extremely low as compared to that of the conventional coating type magnetic recording medium, so that the back coat layer having a small thickness can be produced with a high operating efficiency.

In addition, in accordance with the present invention, when the back coat layer is formed, a gasified lubricant is supplied and introduced into the back coat layer. In consequence, differing from the conventional back coat layer coated on the substrate, the back coat layer prepared according to the present invention can be brought into close contact with the non-magnetic substrate so that the magnetic recording medium exhibiting a high lubricating property can be produced.

Further, in method and apparatus according to the present invention, differing from the conventional coating-type magnetic recording medium, it is unnecessary to use an organic solvent, whereby there arises no problem concerning environmental pollution.

Furthermore, in the case of the ferromagnetic metal thin film type magnetic recording medium, the back coat layer can be formed together with the magnetic layer in a common single apparatus, whereby an effective utilization of apparatus can be achieved.

What is claimed is:

1. A method for producing a magnetic recording medium including a non-magnetic substrate, a magnetic layer formed on one surface of said non-magnetic substrate and a back coat layer formed on an opposite surface of said non-magnetic substrate, both the magnetic layer and backing layer being formed in a single common apparatus comprising the steps of:

forming a magnetic layer on one surface of a non-magnetic substrate in a single common apparatus by vapor deposition;

forming a back coat layer on an opposite surface of said non-magnetic substrate in said single common apparatus by a plasma chemical vapor deposition; and supplying a lubricant, substantially at the time when said back coat layer is formed by the plasma chemical vapor deposition, such that the lubricant is introduced into said back coat layer.

2. An apparatus for producing a magnetic recording medium including a non-magnetic substrate by forming both magnetic layer on one surface of said non-magnetic substrate and a back coat layer formed on an opposite surface of said non-magnetic substrate in said apparatus, said apparatus comprising:

a vacuum chamber, the vacuum chamber containing a first film forming means for forming a magnetic layer on one surface of a non-magnetic substrate, a second film forming means for forming a back coat layer on an opposite surface of said substrate and a lubricant-feeding means for introducing lubricant into the back coat layer;

the first film forming means forming the magnetic layer by vapor deposition;

said second film-forming means for forming said back coat layer by a plasma chemical vapor deposition; and said lubricant-feeding means for supplying a lubricant, substantially at the time when said back coat layer is formed by the plasma chemical vapor deposition, such that the lubricant is introduced into said back coat layer;

said chamber further containing a means for passing said one side of said substrate in front of said first film forming means so that said magnetic layer is formed on said one side of said substrate and a means for passing said opposite side of the substrate in front of said second film forming means and said lubricant feeding means so that said back coat layer containing lubricant is formed on said opposite side of said substrate.

3. An apparatus according to claim 2, wherein a plurality of said film-forming means and a plurality of said lubricant-feeding means are alternately arranged.

4. An apparatus for producing a magnetic recording medium comprising a non-magnetic substrate, a magnetic layer formed on one side of the substrate and a back coating layer on an opposite side of the substrate, the apparatus comprising:

a vacuum chamber, the vacuum chamber containing
a feed roll of initially non-magnetic substrate and a take-up roll for pulling the substrate off of the feed roll, the vacuum chamber further containing a first cooling can disposed in front of a first chemical vapor deposition forming station, the vacuum chamber further containing a second cooling can disposed in front of a second chemical vapor deposition station, the vacuum chamber further containing pair of spaced-apart guide rolls disposed between the first and second cooling cans, the take-up roll pulling the substrate off of the feed roll and around the first cooling can so that the one surface is facing outwards away from the first cooling can, the one surface passing between the first chemical vapor deposition station and the first cooling can so that the magnetic layer can be deposited onto the one surface of the substrate, the substrate further passing around both guide rolls and the second cooling can so that the opposite side of the substrate is facing outwards away from the second cooling can, the opposite side of the substrate passing between the second chemical vapor deposition station and the second cooling can so that the back coat layer can be deposited onto the opposite side of the substrate.

5. The apparatus of claim 4 wherein the vacuum chamber further houses a third chemical vapor deposition station disposed in front of the first cooling can and between the first chemical vapor deposition station and the pair of guide rollers, the third chemical vapor deposition station depositing a layer a protective layer on top of the magnetic layer.

6. The apparatus of claim 4 wherein the second chemical vapor deposition station further comprises a lubricant feed container which deposits lubricant onto the opposite side of the substrate immediately after the back coat layer is deposited onto the opposite side of the substrate.

7. A method of producing a magnetic recording medium comprising an initially non-magnetic substrate, a magnetic layer formed on one side of the substrate and a back coating layer on an opposite side of the substrate, the comprising the following steps:

in a single vacuum chamber, providing a feed roll of an initially non-magnetic substrate and a take-up roll for pulling the substrate off of the feed roll, a first cooling can disposed in front of a first chemical vapor deposition forming station, a second cooling can disposed in front of a second chemical vapor deposition station, and a pair of spaced-apart guide rolls disposed between the first and second cooling cans, pulling the substrate off of the feed roll and around the first cooling can so that one surface is facing outwards away from the first cooling can, passing the one surface of the substrate between the first chemical vapor deposition station and the first cooling can, depositing the magnetic layer onto the one surface of the substrate by chemical vapor deposition, passing the substrate around both guide rolls and the second cooling can so that an opposite side of the substrate is facing outwards away from the second cooling can, passing the opposite side of the substrate between the second chemical vapor deposition station and the second cooling can, and depositing the back coat layer onto the opposite side of the substrate by chemical vapor deposition.

8. The method of claim 7 further comprising the following steps:

providing a third chemical vapor deposition station in the vacuum chamber and in front of the first cooling can and between the first chemical vapor deposition station and the pair of guide rollers, and depositing a layer a protective layer on top of the magnetic layer after the magnetic layer is deposited onto the one side of the substrate and before the substrate is passed around the guide rolls and the second cooling can.

9. The method of claim 7 wherein the second chemical vapor deposition station further comprises a lubricant feed container and wherein the method further comprises the following step:

depositing lubricant onto the opposite side of the substrate immediately after the back coat layer is deposited onto the opposite side of the substrate.

* * * * *